(12) United States Patent
Nomura et al.

(10) Patent No.: US 9,496,214 B2
(45) Date of Patent: Nov. 15, 2016

(54) POWER ELECTRONICS DEVICES HAVING THERMAL STRESS REDUCTION ELEMENTS

(71) Applicant: Toyota Motor Engineering & Manufacturing North America, Inc., Erlanger, KY (US)

(72) Inventors: Tsuyoshi Nomura, Ann Arbor, MI (US); Sang Won Yoon, Ann Arbor, MI (US); Ercan Mehmet Dede, Ann Arbor, MI (US); Shuhei Horimoto, Miyoshi (JP)

(73) Assignee: Toyota Motor Engineering & Manufacturing North American, Inc., Erlanger, KY (US)

( * ) Notice: Subject to any disclaimer, the term of this patent is extended or adjusted under 35 U.S.C. 154(b) by 85 days.

(21) Appl. No.: 13/899,904

(22) Filed: May 22, 2013

(65) Prior Publication Data
US 2014/0346660 A1 Nov. 27, 2014

(51) Int. Cl.
| | | |
|---|---|---|
| *H01L 23/48* | (2006.01) | |
| *H01L 23/498* | (2006.01) | |
| *H01L 21/48* | (2006.01) | |
| *H01L 23/367* | (2006.01) | |
| *H01L 23/00* | (2006.01) | |
| *H01L 23/373* | (2006.01) | |

(52) U.S. Cl.
CPC ...... *H01L 23/49844* (2013.01); *H01L 21/4871* (2013.01); *H01L 21/4875* (2013.01); *H01L 23/367* (2013.01); *H01L 23/3735* (2013.01); *H01L 23/562* (2013.01); *H01L 2924/0002* (2013.01)

(58) Field of Classification Search
CPC ........... H01L 23/49844; H01L 23/367; H01L 23/3735; H01L 23/56; H01L 2924/0002; H01L 21/4871; H01L 21/4875
See application file for complete search history.

(56) References Cited

U.S. PATENT DOCUMENTS

| | | | |
|---|---|---|---|
| 5,367,124 A | 11/1994 | Hoffman et al. | |
| 5,903,048 A * | 5/1999 | Bandou ................. | H01L 21/565 257/670 |
| 6,424,023 B1 * | 7/2002 | Kim et al. ................... | 257/666 |
| 6,603,195 B1 | 8/2003 | Caletka et al. | |
| 6,803,258 B2 * | 10/2004 | Ito et al. ...................... | 438/123 |
| 6,844,621 B2 | 1/2005 | Morozumi et al. | |
| 7,786,486 B2 | 8/2010 | Casey et al. | |
| 8,373,257 B2 | 2/2013 | Shi et al. | |
| 2001/0010394 A1 * | 8/2001 | Hisano .............. | H01L 23/49537 257/690 |
| 2002/0163015 A1 * | 11/2002 | Lee ..................... | H01L 23/3107 257/200 |
| 2007/0125449 A1 * | 6/2007 | Kajiwara et al. ................ | 148/23 |
| 2007/0200206 A1 * | 8/2007 | Wong et al. ................. | 257/666 |
| 2007/0290332 A1 | 12/2007 | Chiu et al. | |
| 2008/0296784 A1 * | 12/2008 | Shimanuki .................... | 257/784 |
| 2009/0236706 A1 * | 9/2009 | Chen ................. | H01L 23/49503 257/675 |

* cited by examiner

*Primary Examiner* — Su C Kim
(74) *Attorney, Agent, or Firm* — Dinsmore & Shohl LLP (57) ABSTRACT

Power electronics devices having thermal stress reduction elements are disclosed. A power electronics device includes a heat source having a heat source perimeter, a first conduction member coupled to the heat source, and a substrate coupled to the first conduction member. The first conduction member includes a support portion that extends to at least the heat source perimeter and a plurality of finger portions extending from the support portion and separated from one another by web regions, where the plurality of finger portions have a finger thickness that is greater than a web thickness of the web regions.

17 Claims, 7 Drawing Sheets

POWER ELECTRONICS DEVICES HAVING THERMAL STRESS REDUCTION ELEMENTS

TECHNICAL FIELD

The present specification generally relates to power electronics devices and, more particularly, power electronics devices having thermal stress reduction elements.

BACKGROUND

Power electronics modules may generate significant heat in operation. Semiconductor devices of power modules are conventionally mounted to heat dissipative substrates that allow heat generated in the chip to be drawn away from the chip itself, which may increase chip life. With an increase in emphasis on weight-lightening, heat spreader designs may be designed progressively thinner. Alternatively, more advanced cooling structures may be implemented in addition to or instead of incorporating large heat sinks into the power module. In some embodiments, the variation in temperature and/or the variation in the coefficient of thermal expansion of contacting components may induce mechanical stress into the bonding line between a chip and a substrate to which the chip is mounted.

An increase in the mechanical stress between the bonding line that joins the chip with the substrate may reduce the useful life of the chip itself, thereby reducing the life of the power module. A reduction in the useful life of the power module may increase costs associated with use of the power modules.

Accordingly, power electronics devices having thermal stress reduction elements may be desired.

SUMMARY

In one embodiment, a power electronics device includes a heat source having a heat source perimeter, a first conduction member coupled to the heat source, and a substrate coupled to the first conduction member. The first conduction member includes a support portion that extends to at least the heat source perimeter and a plurality of finger portions extending from the support portion and separated from one another by web regions, where the plurality of finger portions have a finger thickness that is greater than a web thickness of the web regions.

In another embodiment, a power electronics device includes a heat source having a heat source perimeter, a first conduction member coupled to the heat source, and a substrate coupled to the first conduction member. The first conduction member has a support portion that extends to at least the heat source perimeter and a plurality of finger portions extending from the support portion, and the first conduction member is discontinuous along a first conduction member perimeter between two adjacent finger portions.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
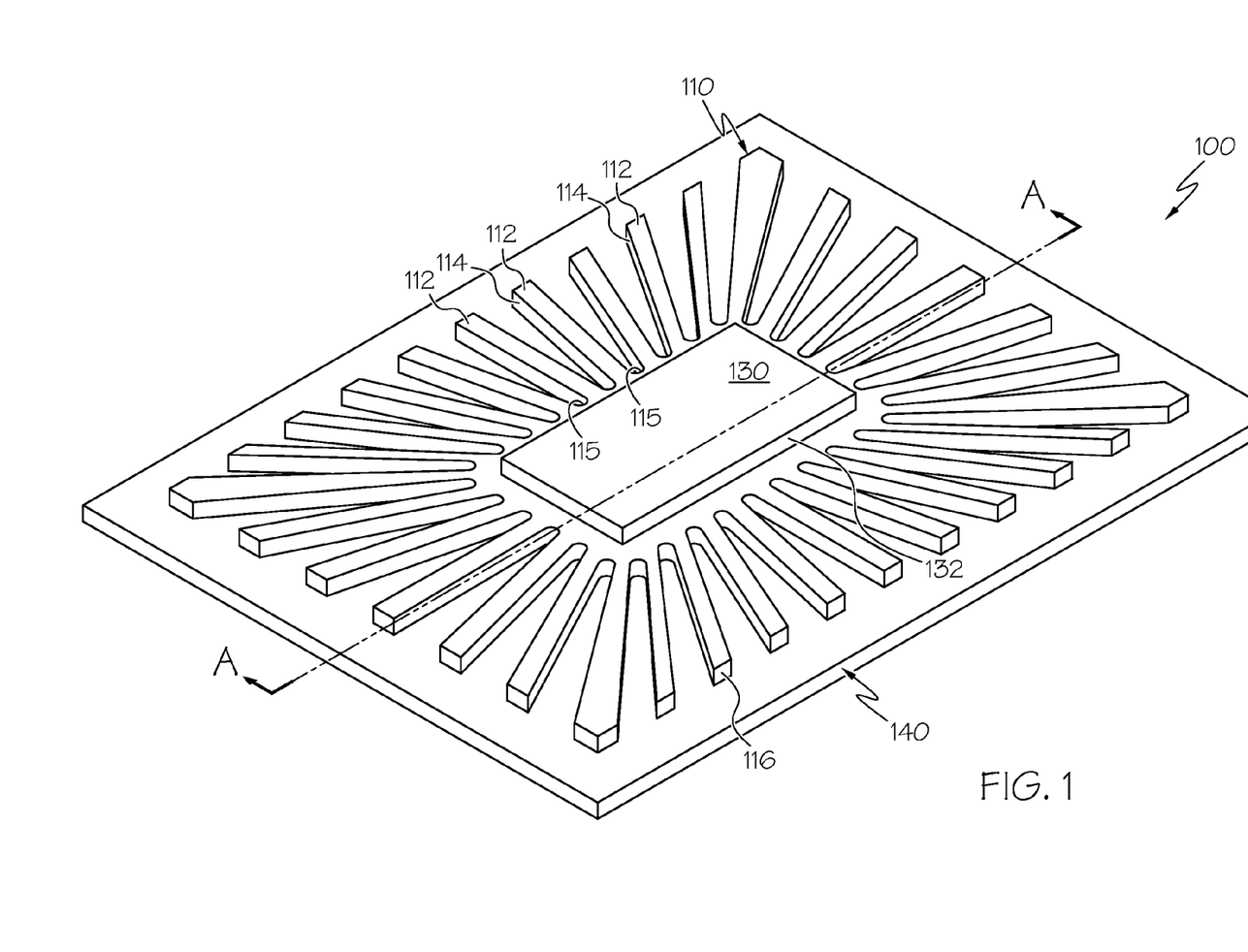
FIG. 1 schematically depicts a side perspective view of a portion of a power electronics device according to one or more embodiments shown or described herein.
Figure 2:
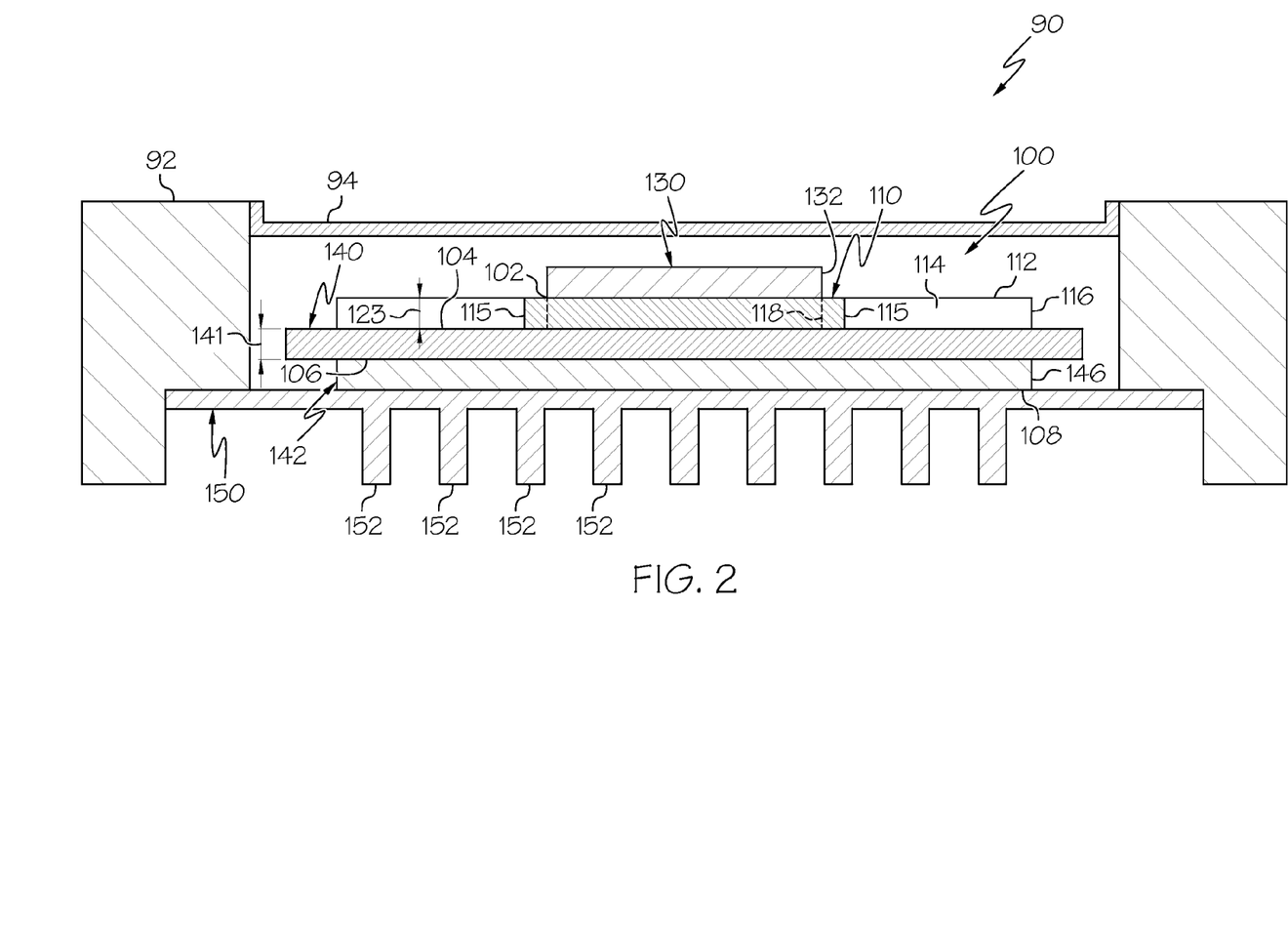
FIG. 2 schematically depicts a side sectional view of the power electronics device shown along line A-A of FIG. 1 according to one or more embodiments shown or described herein.

One embodiment of a power electronics device that incorporates thermal stress reduction features is generally depicted in FIGS. 1 and 2. The power electronics device includes a heat source, a first conduction member coupled to the heat source, and a substrate coupled to the first conduction member. The outer periphery of the heat source defines a heat source perimeter. The first conduction member has a support portion that extends to at least the heat source perimeter. The first conduction member also includes a plurality of finger portions that extend away from the support portion and are separated from one another by web regions. The plurality of finger portions have finger thicknesses that are greater than the web thickness of the web region, such that the bending stiffness of the first conduction member in the web regions is less than the bending stiffness of the finger portions. The localized reduction in stiffness of the first conduction member may reduce the stress that may be induced into the bonding line between the first conduction member and the substrate. Various embodiments of the power electronics devices and power electronics devices incorporating thermal stress reduction will be described in more detail herein.

Referring to FIG. 1, a portion of a power electronics device 100 is depicted. FIG. 1 includes depiction of the heat source 130, a first conduction member 110 coupled to the heat source 130, and a substrate 140 coupled to the first conduction member 110 opposite the heat source 130. The heat source 130 may be a variety of electronic devices that produce heat including integrated circuits, for example, computer processing units, graphical processing units, chipsets, and the like. In some embodiments, the heat source 130 may be a power semiconductor device such as those utilized in power inverters, voltage rectifiers, voltage regulators, and the like. Exemplary power semiconductor devices include, but are not limited to, power insulated-gate bi-polar transistors, metal-oxide field-effect transistors, and the like. In operation, the heat source 130 generally produces heat as a waste byproduct of the designed operative function of the heat source 130. The heat produced by the heat source 130 in the power electronics device 100 is generally undesired, as electrical components are conventionally susceptible to temperature malfunction or permanent failure if an over-temperature condition is realized. Accordingly, the first conduction member 110, to which the heat source 130 is coupled, is adapted to draw waste heat away from the heat source 130 so that the waste heat produced by the heat source 130 can be rejected away from the heat source 130, thereby managing the maximum temperature at which the heat source 130 operates.

The heat source 130 includes a heat source perimeter 132 that extends around the outer periphery of the heat source 130. When the heat source 130 is coupled to the first conduction member 110, the heat source perimeter 132 defines a support portion 118 of the first conduction member 110 as the portion of the first conduction member 110 positioned proximate to the heat source 130, as depicted in FIG. 2. The first conduction member 110 may be uniform and have a continuous thickness at positions inside of the support portion 118. Referring to FIG. 1, at positions outside of the support portion 118, the first conduction member 110 includes a plurality of finger portions 112 that extend outward from the support portion 118 towards a first conduction member perimeter 116. The finger portions 112 are separated from one another by web regions 114. The finger portions 112 extend from a throat 115 that joins adjacent finger portions 112 with one another. The web regions 114 of the first conduction member 110 are defined by the finger portions 112 and the throats 115 as the portions of the first conduction member 110 having thicknesses less than the finger portions 112. The plurality of finger portions 112 and web regions 114 are arranged along the first conduction member 110 such that the first conduction member 110 is interrupted in at least one position evaluated along the first conduction member perimeter 116.

Figure 3:
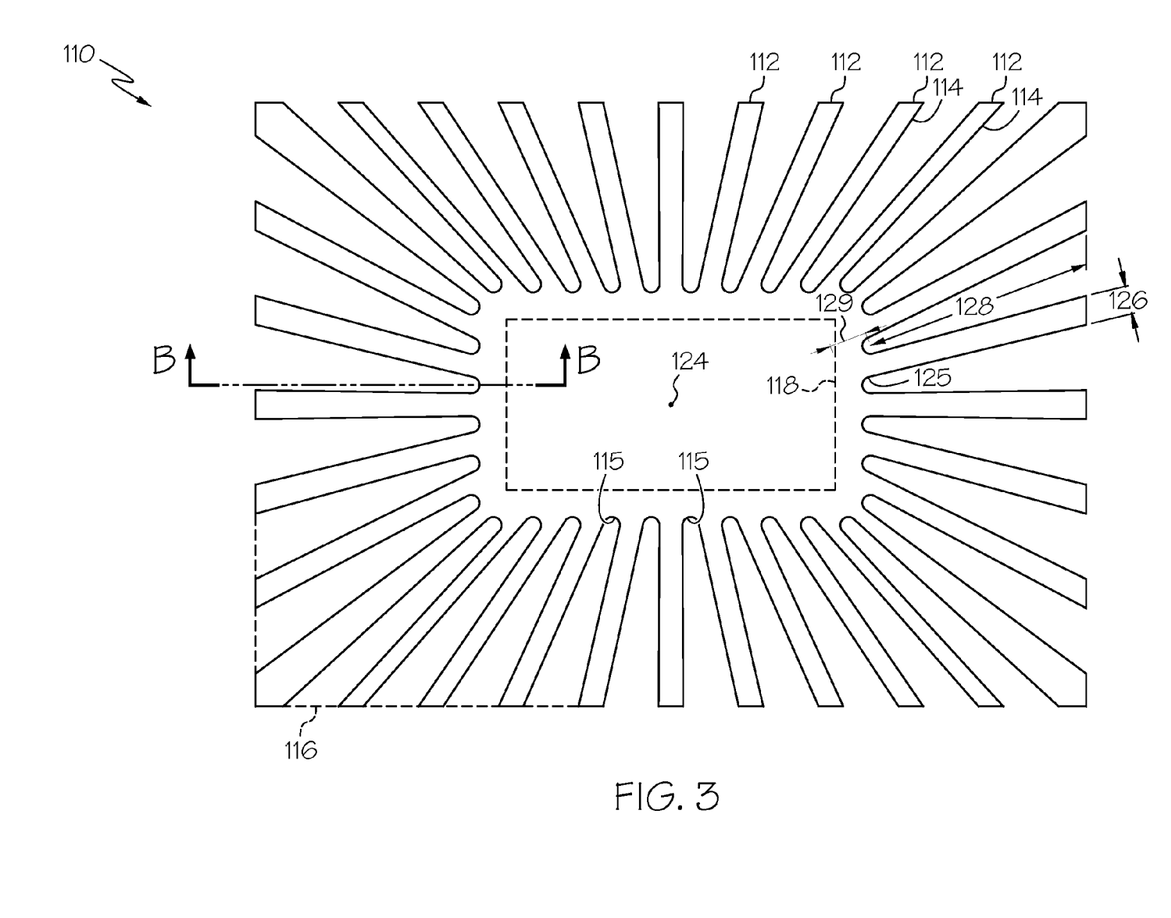
FIG. 3 schematically depicts a top view of a heat conduction member of a power electronics device according to one or more embodiments shown or described herein.

The plurality of finger portions 112 of the first conduction member 110 may have a variety of configurations of minimum length 128, minimum width 126, and finger thickness 123 to suit a particular design (FIG. 3). In one embodiment, at least one of the finger portions 112 may have a minimum width 126 and a minimum length 128 evaluated from the first conduction member perimeter 116 to a tangent transition 125 to the throat 115, where a ratio of the minimum length 128 to the minimum width 126 is greater than about 4:1 including being greater than about 5:1, including being greater than about 6:1, including being greater than about 8:1. Additionally or in the alternative, the plurality of finger portions 112 may be sized such that the finger portions 112 extend a distance greater than the distance the finger portions 112 are spaced from the support portion 118. At least one of the finger portions 112 may have a minimum length 128 that is greater than a minimum spacing distance 129 from the support portion 118 to the tangent transition 125 to the throat 115, including being in a ratio where the minimum length 128 to the minimum spacing distance 129 is greater than about 2:1 including being greater than about 4:1.

Referring again to FIG. 2, a power device 90 that incorporates the power electronics device 100 is depicted. In the depicted embodiment, the power electronics device 100 includes the heat source 130, the first conduction member 110, the substrate 140, and a second conduction member 142 coupled opposite the first conduction member 110 to the substrate 140. As depicted in FIG. 2, the second conduction member 142 includes a second conduction member perimeter 146 that is generally equivalent in size to the first conduction member perimeter 116, such that the plurality of finger portions 112 extend to a position proximate to the second conduction member perimeter 146. The first conduction member 110, the substrate 140, and the second conduction member 142 complete a conduction path from the heat source 130 to a cooling structure 150 that allows heat to be conducted away from the heat source 130 and rejected into the environment away from the power device 90. In the depicted embodiment, the power device 90 includes a housing 92 into which the power electronics device 100 is inserted. Additional electrical connections with the heat source 130 may be made by conductor elements (not shown) that extend through the housing 92. The power device 90 also includes a cover plate 94 that is coupled to the housing 92 and encloses the heat source 130. In some embodiments, the interior of the housing 92 may be potted, for example with a hardening resin, that at least partially encapsulates the heat source 130, thereby providing additional protection to the heat source 130 and to any conductor elements.

In the embodiment depicted in FIG. 2, the cooling structure 150 is a heat sink having a plurality of fins 152. Cooling fluid, for example and without limitation, air or water, is directed along the fins 152. As the cooling fluid passes along the fins 152, heat that was rejected from the heat source 130 is transferred to the cooling fluid, which is subsequently directed away from the cooling structure 150 and away from the power device 90. While a particular heat sink design is depicted in FIG. 2, it should be understood that the cooling structure 150 may take a variety of forms including, for example and without limitation, jet impingement coolers, cooling fluid phase-change coolers, porous walled heat sinks, and the like.

The components of the power device 90 may be made from materials that are conventionally known for use with power electronics devices. The heat source 130 may be a composite construction that includes a semiconductor element, for example, a semiconductor device. The first conduction member 110 and the second conduction member 142 are made from materials having high electrical and thermal conductivities, for example, copper or aluminum alloys. The first conduction member 110 and the second conduction member 142 may be similar materials or may be dissimilar materials. The substrate 140 is a material having low electrical and thermal conductivities as compared to the first conduction member 110 and the second conduction member 142. The substrate 140 may be made from a variety of materials including, for example and without limitation, ceramics such as aluminum nitride, silicon carbide, and the like.

The components of the power device 90 may be coupled to one another along bonding lines 102, 104, 106, 108 between adjacent faces of the components. In some embodiments, the bonding lines 102, 104, 106, 108 may include a solder, a silver sinter material, or a transient liquid-phase material.

Because the components of the power device 90 are made from a variety of materials, adjacent components of the power device 90 may have divergent coefficients of thermal expansion. For example, the coefficient of thermal expansion of silicon carbide may be about 4 ppm/K while the coefficient of thermal expansion of copper may be about 16.7 ppm/K. Accordingly, for components of the power device 90 that are coupled to one another along bonding lines, cycling the components from an ambient temperature to an elevated temperature differentially expands and contracts the components having various coefficients of thermal expansion. Because of the divergent expansion and contraction of adjacent and coupled components, stress may be induced into the bonding lines. Periodic cycling of stress in the bonding lines may lead to crack formation within the bonding lines.

Still referring to FIG. 2, to reduce the stress that may be induced into the bonding lines between adjacent components of the power device 90, the first conduction member 110 includes the plurality of finger portions 112 that extend outward from the support portion 118 and are separated by web regions 114, as described hereinabove. The plurality of finger portions 112 maintain the maximum overall dimensions of the first conduction member 110 while decreasing the stiffness of the first conduction member 110 as compared with a conventionally designed first conduction member that extends to the same first conduction member perimeter. When a thermal load is applied to the first conduction member 110 by the heat source 130, the first conduction member 110 will tend to expand based on the coefficient of thermal expansion. Because the first conduction member 110 is coupled to the substrate 140, which has a lower coefficient of thermal expansion than the first conduction member 110, the portion of first conduction member 110 positioned proximate to the substrate 140 will expand less than the corresponding and coupled portions of the substrate 140. This differential in growth of the first conduction member 110 and the substrate 140 may cause stress to increase in the bonding line 104 between the first conduction member 110 and the substrate 140. In embodiments where the coefficient of thermal expansion of the first conduction member 110 is greater than the coefficient of thermal expansion of the substrate 140, introduction of heat tends to induce stress in a tensile direction and in a shear direction to the bonding line 104 that tends to separate the first conduction member 110 from the substrate 140.

Referring to FIGS. 1 and 2, because the finger portions 112 and the web regions 114 of the first conduction member 110 interrupt the structure of the first conduction member 110 at positions outside of the support portion 118, the first conduction member 110 exhibits a reduced stiffness as compared to conventional designs having a first conduction member that extends to a first conduction member perimeter with a uniform thickness. In the embodiment depicted in FIGS. 1 and 2, each of the finger portions 112 extend away from the support portion 118. Because the finger portions 112 are separated from one another by the web regions 114, the finger portions 112 are unsupported from one another at positions outside of the throats 115. Accordingly, by interrupting the first conduction member 110, the stiffness of the first conduction member 110 is reduced.

Reducing the stiffness of the first conduction member 110 may reduce the amount of stress that the first conduction member 110 imparts to the bonding line 104 that couples the first conduction member 110 to the substrate 140. When heat is introduced to the first conduction member 110, the differential in coefficients of thermal expansion will continue to increase the size of the first conduction member 110 relative to the substrate 140. However, because the finger portions 112 of the first conduction member 110 exhibit decreased stiffness, the finger portions 112 are limited in the amount of stress that can be induced into the bonding line 104. The finger portions 112 will flex, thereby accommodating some of the differential growth between the first conduction member 110 and the substrate 140, and reducing the stress induced to the bonding line 104.

Additionally, by maintaining the overall dimensions of the first conduction member 110 such that the plurality of finger portions 112 extend to the first conduction member perimeter 116 similar to a conventional design of a first convection member having a uniform thickness that extends to the same first conduction member perimeter, the first conduction member 110 depicted in FIGS. 1 and 2 conducts heat at a sufficient rate away from the heat source 130 through the substrate 140 and the second conduction member 142 such that the heat generated by the heat source 130 is rejected into the environment while maintaining the desired temperature of the heat source 130.

Figure 4:
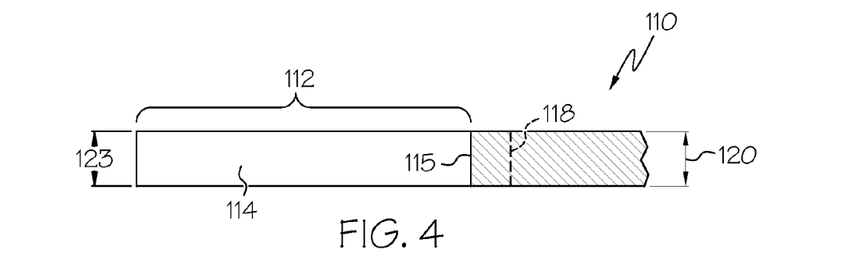
FIG. 4 schematically depicts a partial side sectional view of the heat conduction member of a power electronics device shown along line B-B of FIG. 3 according to one or more embodiments shown or described herein.
Figure 5:
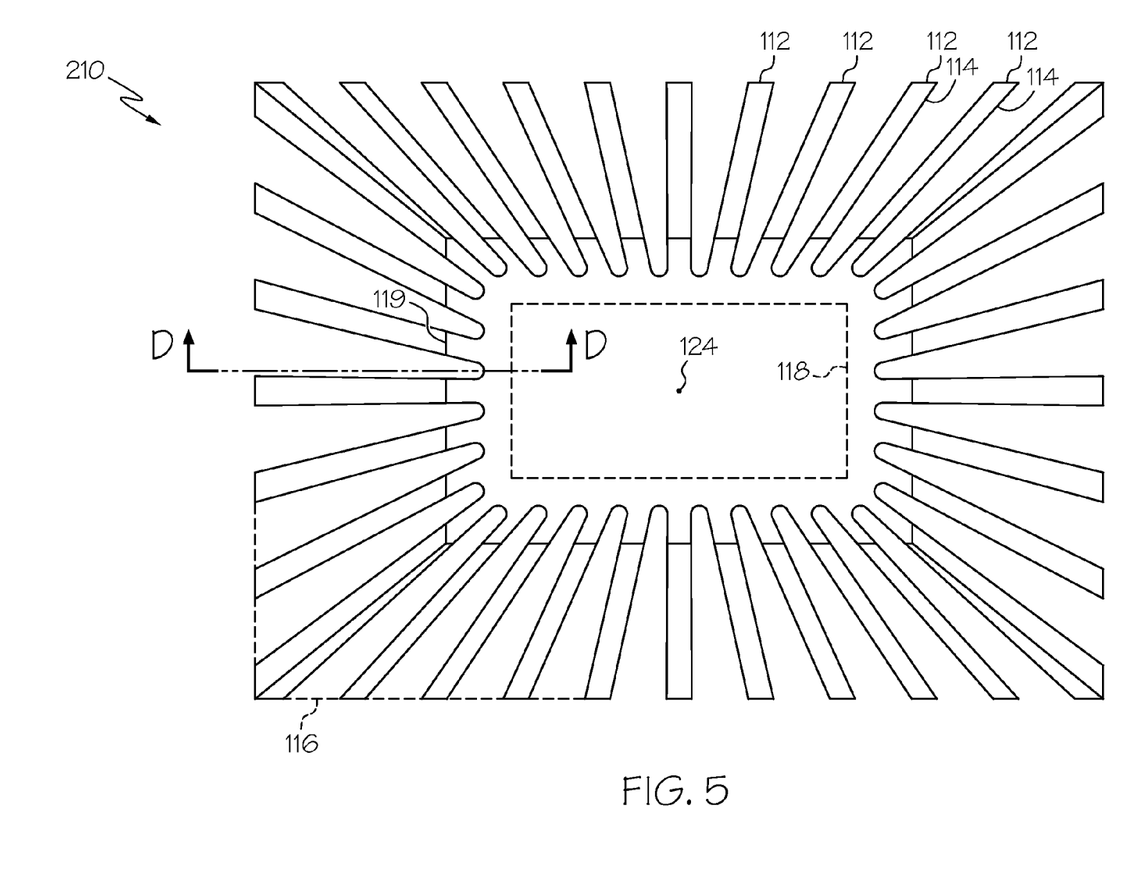
FIG. 5 schematically depicts a top view of a heat conduction member of a power electronics device according to one or more embodiments shown or described herein.
Figure 6:
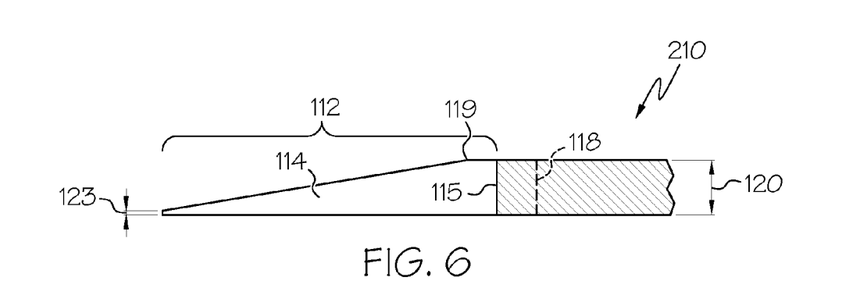
FIG. 6 schematically depicts a partial side sectional view of the heat conduction member of a power electronics device shown along line D-D of FIG. 5 according to one or more embodiments shown or described herein.
Figure 7:
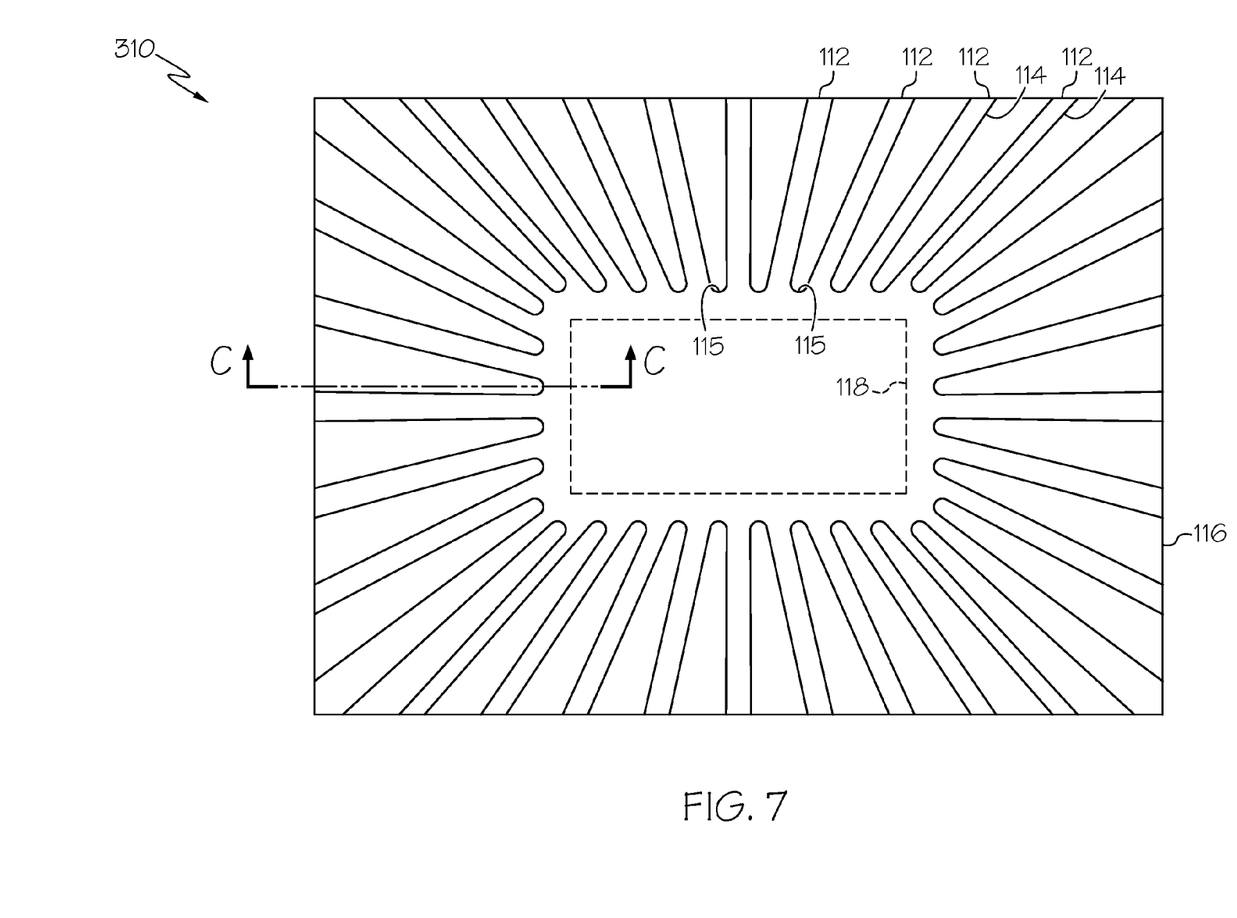
FIG. 7 schematically depicts a top view of a heat conduction member of a power electronics device according to one or more embodiments shown or described herein.
Figure 8:
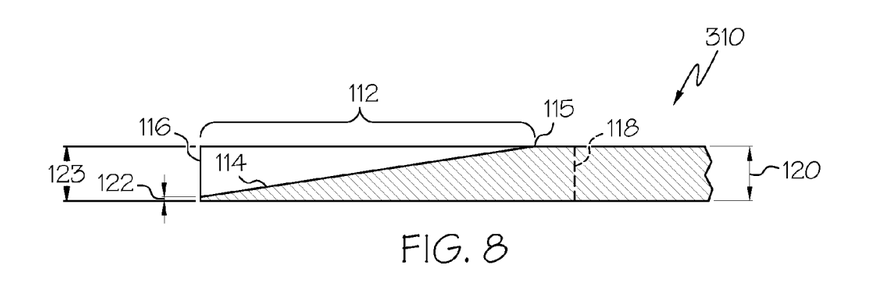
FIG. 8 schematically depicts a partial side sectional view of the heat conduction member of a power electronics device shown along line C-C of FIG. 7 according to one or more embodiments shown or described herein.
Figure 9:
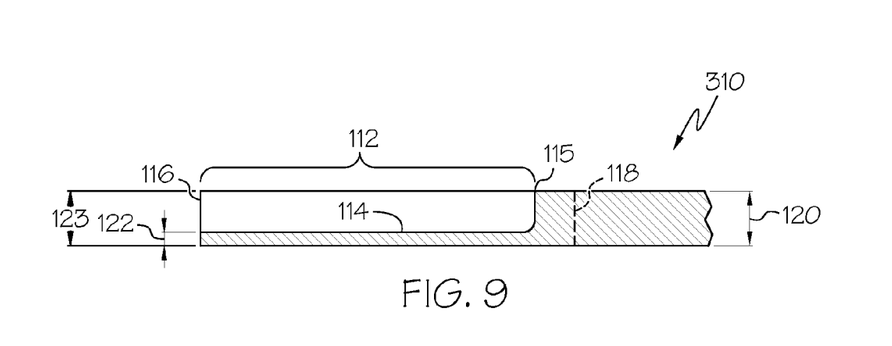
FIG. 9 schematically depicts a partial side sectional view of the heat conduction member of a power electronics device shown along line C-C of FIG. 7 according to one or more embodiments shown or described herein.

In the embodiment depicted in FIGS. 3 and 4, finger portions positioned proximate to the centroid 124 of the support portion 118 are oriented to extend in a generally normal orientation relative to the support portion 118. Finger portions positioned distally from the centroid 124 are biased away from normal with the support portion 118. It should be understood, however, the finger portions 112 having a variety of shapes may be incorporated into first conduction members without departing from the scope of the present disclosure.

In the embodiment depicted in FIGS. 3 and 4, the support portion 118 of the first conduction member 110 has a first conduction member thickness 120. The finger portions 112 may be defined by the web regions 114 having a thickness less than the first conduction member thickness 120. In the embodiment depicted in FIGS. 3 and 4, the web regions 114 have zero thickness. In the embodiment depicted in FIGS. 3 and 4, the first conduction member 110 is discontinuous at each of the web regions 114 between adjacent finger portions 112 evaluated along the first conduction member perimeter 116.

Referring again to FIG. 2, while the first conduction member 110 having the plurality of finger portions 112 has decreased surface area as compared with a conventional design that extends uninterrupted to the first conduction member perimeter, the efficacy with which the first conduction member 110 having the plurality of finger portions 112 conducts heat into the substrate 140 and the second conduction member 142 is sufficient to maintain temperature of the heat source 130 within a desired target range. Heat conducted from the heat source 130 to the support portion 118 of the first conduction member 110 is conducted along the length of the plurality of finger portions 112 towards the first conduction member perimeter 116. Because the first conduction member 110, including the finger portions 112, may be made of a material having a high conductive heat transfer coefficient, heat may be readily conducted away from the support portion 118 and along the finger portions 112 towards the first conduction member perimeter 116.

Heat is also conducted from the plurality of finger portions 112 into the substrate 140 and is conducted through the substrate 140 towards the second conduction member 142. Heat also conducts within the substrate 140 in directions transverse to the direction from the first conduction member 110 towards the second conduction member 142. Accordingly, heat that is conducted from each of the plurality of finger portions 112 of the first conduction member 110 is conducted in a direction towards the second conduction member 142 and is conducted in directions transverse to the direction towards the second conduction member 142, including in a direction towards adjacent finger portions 112. To maintain efficacy of the first conduction member 110 in conducting heat to the substrate 140, the size of the finger portions 112 and the spacing between the finger portions 112 (defined by the web regions 114) may be sized to balance the heat that is conducted away from the heat source 130 and the stress induced to the bonding line 104 between the first conduction member 110 and the substrate 140. In embodiments of the power electronics devices 100, the plurality of finger portions 112 and the web regions 114 of the first conduction member 110 may be sized such that a maximum spacing distance between at least two adjacent finger portions 112 is less than about 5 times a substrate thickness 141 of the substrate 140, including being less than about 4 times the substrate thickness 141 of the substrate 140, including being less than about 3 times the substrate thickness 141 of the substrate 140, including being less than about 2 times the substrate thickness 141 of the substrate 140, including being less than about 1 times the substrate thickness 141 of the substrate 140. By limiting the maximum spacing distance between adjacent finger portions 112, reduction in conductive heat transfer performance of the first conduction member 110 as compared to conventionally designed first conduction members that extend with uniform thickness to the first conduction member perimeter may be minimized.

Referring to FIGS. 5-9, additional embodiments of the first conduction member 210, 310 are depicted. In the embodiments depicted in FIGS. 5 and 6, the finger portions 112 of the first conduction member 210 are tapered in thickness at positions outside of a transition region 119, such that the finger thickness 123 of the finger portions 112 decreases with increasing distance from the support portion 118. In these embodiments, the web regions 114 are regions of the first conduction member 210 having no thickness. In the embodiments of the first conduction member 310 depicted in FIGS. 7-9, the web regions 114 that are positioned between adjacent finger portions 112 have a thickness greater than zero over at least a portion of the web region 114. In the depicted embodiments, the web regions 114 extend to the first conduction member perimeter 116. In the embodiment depicted in FIG. 8, the web region 114 tapers from the first conduction member thickness 120 (here, evaluated at positions interior to the support portion 118) at positions proximate to the throat 115 to a minimum web thickness 122 at positions proximate to the first conduction member perimeter 116. In the embodiment depicted in FIG. 9, the web region 114 extends over a majority of a distance from the throat 115 to the first conduction member perimeter 116 at the minimum web thickness 122, which is less than the first conduction member thickness 120 at regions interior to the support portion 118. It should be understood that a variety of configurations of the web regions 114 having a minimum web thickness 122 less than the first conduction member thickness 120 may be selected without departing from the scope of the present disclosure. In both of the embodiments depicted in FIGS. 8 and 9, relief of the web region 114 from the first conduction member thickness 120 reduces the stiffness of the first conduction member 310 as compared with conventionally designed first conduction members that extend at a uniform thickness to the first conduction member perimeter.

Figure 10:
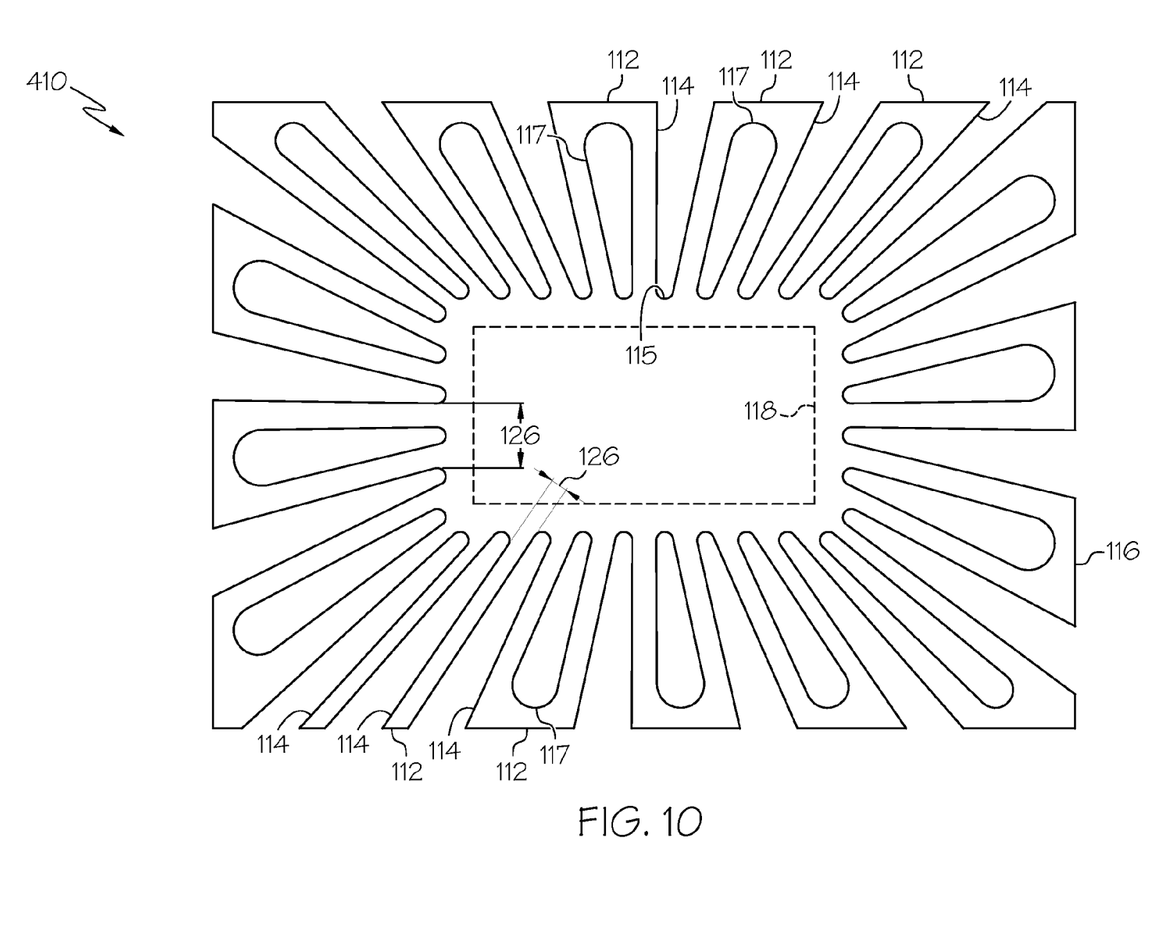
FIG. 10 schematically depicts a top view of a heat conduction member of a power electronics device according to one or more embodiments shown or described herein.

Referring now to FIG. 10, an additional embodiment of the first conduction member 410 is depicted. In this embodiment, the first conduction member 410 includes finger portions 112 having a variety of minimum widths 126. The finger portions 112 of the first conduction member 410 having increased minimum widths 126 include softening channels 117 positioned between the first conduction member perimeter 116 and the support portion 118. The softening channels 117 may maintain the stiffness of the first conduction member 410 to a predetermined level.

It should now be understood that power electronics devices according to the present disclosure may include a first conduction member having a support portion and a plurality of finger portions that extend from the support portion and are separated from one another by web regions. The finger portions and the web regions reduce the stiffness of the first conduction member while maintaining the heat conduction characteristics of a conventionally-designed first conduction member. The first conduction member having the finger portions and the web regions is less stiff than conventionally-design first conduction members, such that stress induced into bonding regions between the first conduction member and a substrate having mismatched coefficients of thermal expansion may be controlled.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:
1. A power electronics device comprising:
a heat source having a heat source perimeter;
a first conduction member coupled to the heat source, the first conduction member having a support portion that extends to at least the heat source perimeter and a plurality of finger portions extending from the support portion and separated from one another by web regions, the plurality of finger portions having a finger thickness that is greater than a web thickness of the web regions, wherein:
the finger portions of the first conduction member are tapered such that the finger thickness of the first conduction member decreases with increasing distance from the support portion;
the plurality of finger portions is in direct contact with the support portion of the first conduction member; and
the web regions have a thickness greater than zero; and
a substrate coupled to the first conduction member, wherein the substrate has a lower coefficient of thermal expansion than the first conduction member.

2. The power electronics device of claim 1, wherein the first conduction member is discontinuous along a first conduction member perimeter between at least two adjacent fingers portions.

3. The power electronics device of claim 1, further comprising a second conduction member coupled to the substrate opposite the first conduction member.

4. The power electronics device of claim 3, wherein the second conduction member comprises a second conduction member perimeter, and at least one of the plurality of finger portions extends to a first conduction member perimeter proximate to the second conduction member perimeter.

5. The power electronics device of claim 3, further comprising a cooling structure coupled to the second conduction member opposite the substrate, the cooling structure removing heat that is rejected from the heat source.

6. The power electronics device of claim 1, wherein a maximum spacing between at least two adjacent finger portions of the first conduction member is less than or equal to about 4 times a substrate thickness of the substrate.

7. The power electronics device of claim 1, wherein finger portions positioned proximate to a centroid of the support portion are generally normal to the heat source perimeter.

8. The power electronics device of claim 1, wherein at least one of the finger portions has a minimum length and a minimum width, a minimum length to minimum width ratio being greater than 5:1.

9. The power electronics device of claim 1, wherein for at least one of the plurality of finger portions, a minimum distance from a first conduction member perimeter to a throat is greater than a minimum spacing distance from the throat to the support portion.

10. The power electronics device of claim 9, where a ratio of the minimum distance from the first conduction member perimeter to the throat to the minimum spacing distance from the throat to the support portion is greater than 2:1.

11. A power electronics device comprising:
a heat source having a heat source perimeter;
a first conduction member coupled to the heat source, the first conduction member having a support portion that extends to at least the heat source perimeter and a plurality of finger portions extending from the support portion, the first conduction member being discontinuous along a first conduction member perimeter between two adjacent finger portions, wherein the plurality of finger portions is in direct contact with the support portion of the first conduction member; and a substrate coupled to the first conduction member, wherein the finger portions of the first conduction member are tapered from the support portion such that a finger thickness of the first conduction member decreases toward the substrate with increasing distance from the support portion.

12. The power electronics device of claim 11, further comprising a second conduction member coupled to the substrate opposite the first conduction member.

13. The power electronics device of claim 12, further comprising a cooling structure coupled to the second conduction member opposite the substrate, the cooling structure removing heat that is rejected from the heat source.

14. The power electronics device of claim 11, wherein a maximum spacing between at least two adjacent finger portions of the first conduction member is less than or equal to about 4 times a substrate thickness of the substrate.

15. The power electronics device of claim 11, wherein at least one of the finger portions has a minimum length and a minimum width, a minimum length to minimum width ratio being greater than 5:1.

16. The power electronics device of claim 11, wherein for at least one of the plurality of finger portions, a minimum distance from a first conduction member perimeter to a throat is greater than a minimum spacing distance from the throat to the support portion.

17. The power electronics device of claim 16, where a ratio of the minimum distance from the first conduction member perimeter to the throat to the minimum spacing distance from the throat to the support portion is greater than 2:1.

* * * * *